United States Patent [19]

Fay et al.

[11] Patent Number: 4,704,033

[45] Date of Patent: Nov. 3, 1987

[54] MULTIPLE WAVELENGTH LINEAR ZONE PLATE ALIGNMENT APPARATUS AND METHOD

[75] Inventors: Bernard Fay; W. Thomas Novak, both of San Jose, Calif.

[73] Assignee: Micronix Corporation, Los Gatos, Calif.

[21] Appl. No.: 836,784

[22] Filed: Mar. 6, 1986

[51] Int. Cl.[4] .......................... G01B 9/02; G01B 11/27
[52] U.S. Cl. .................................... 356/363; 356/354; 356/401
[58] Field of Search .............. 356/354, 355, 349, 356, 356/363, 400, 401

[56] References Cited

U.S. PATENT DOCUMENTS 4,311,389  1/1982  Fay et al. ........................ 356/400 X

Primary Examiner—Davis L. Willis
Assistant Examiner—S. A. Turner
Attorney, Agent, or Firm—Thomas S. MacDonald; Alan H. MacPherson; Paul J. Winters

[57] ABSTRACT

An optical alignment apparatus and method for a semiconductor lithography mask and wafer utilizes two monochromatic light sources of different wavelengths. The mask contains targets in the form of linear Fresnel zone plates and the wafer contains a reflecting grating. Incident illumination from the two light sources illuminates the mask targets and is reflected from the wafer gratings in various intensity depending on the physical characteristics of the wafer and mask layers and thicknesses and by the targets. A detector detects the strongest of the diffracted return beams from each of the monochromatic light sources and uses the strongest to align the targets and grating on the mask and wafer for more accurate printing of mask patterns on the wafer.

17 Claims, 4 Drawing Figures

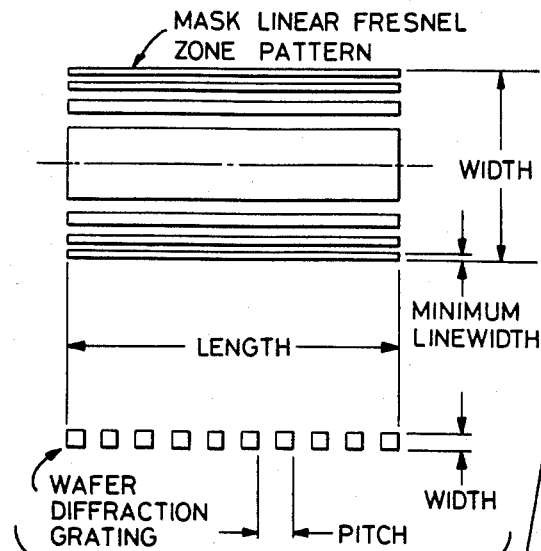
FIG._1.
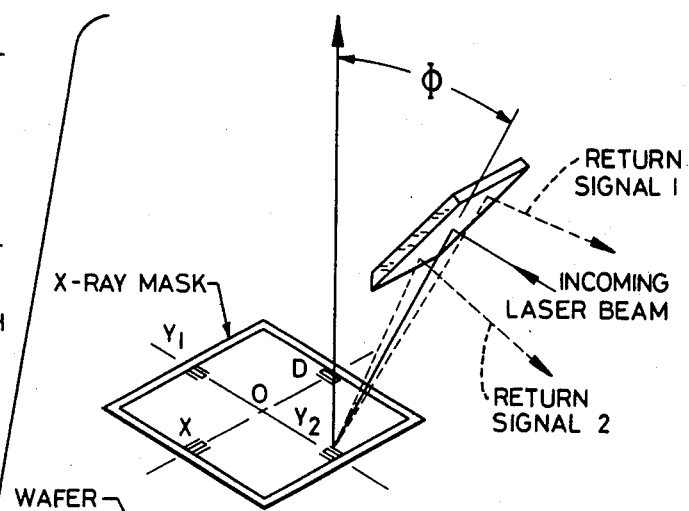
FIG._3.
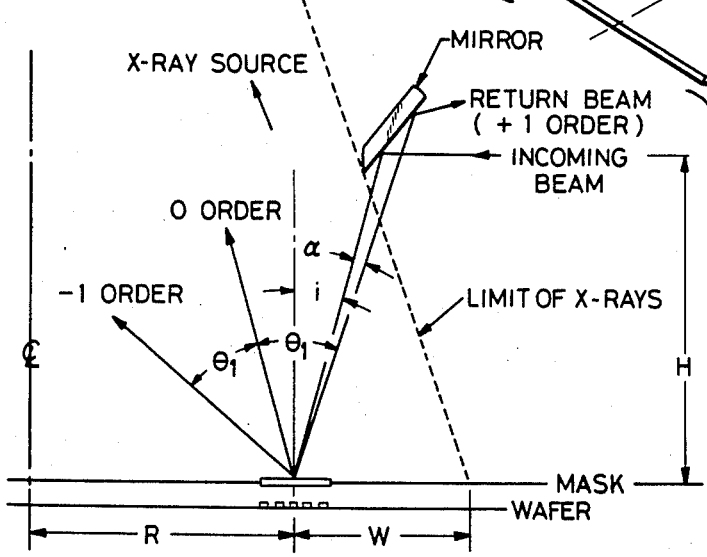
FIG._2.
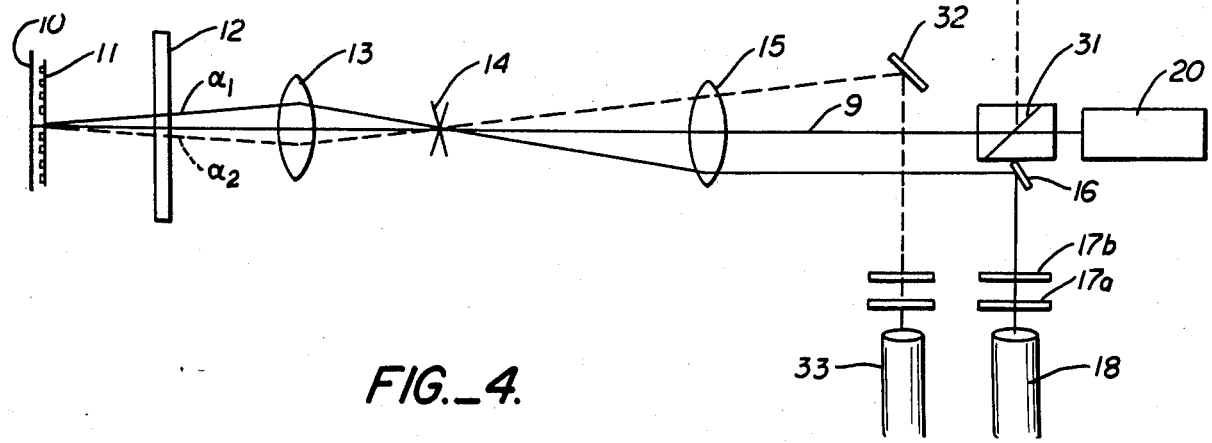
FIG._4.

MULTIPLE WAVELENGTH LINEAR ZONE PLATE ALIGNMENT APPARATUS AND METHOD

RELATED APPLICATION

This application relates to U.S. application Ser. No. 06/336,780, filed Mar. 6, 1986 entitled "Mask Leveling Method and Apparatus" the same inventors filed concurrently. Such application is incorporated herein by reference.

BACKGROUND OF THE INVENTION

1. Field of the Invention

This invention relates to the x-ray lithography used for the production of fine patterns on semiconductor substrates or wafers to produce very large scale integrated circuits. More particularly, the invention concerns a step and repeat alignment apparatus and method of linear zone plate aligning of pattern masks and semiconductor wafers writing monochromatic laser illumination.

2. Prior Art

Alignment by the use of linear zone plates is described in U.S. Pat. No. 4,311,389 Bernard Pay et al. A single laser source of monochromatic light is employed to illuminate a linear Fresnel zone plate (LZP) formed on a mask which light passes through transparent areas on the linear Fresnel zone and reflected from a reflecting grating inscribed on a wafer and a return beam diffracted by the Fresnel zone marks. While this apparatus and method has been successfully used, a problem has existed due to the extreme monochromatic nature of the laser illumination and the fact that typical wafers have many thin layers of silicon oxide, silicon nitride, polysilicon or the like thereon which interact with the laser beam to improperly diffract light to the wafer targets. This may also be caused by the particular thickness(es) of the thin layers. As a result, the alignment signal will be too low to obtain an accurate alignment. While it is possible to adjust the integrated circuit manufacturing process to alter the thickness of the layers on the wafer, in many cases, other constraints, e.g., electrical properties of these layers prevent a user from doing so.

In order that light diffract from a grating, there must be a periodic difference in phase or transmission in the grating. The grating of concern is the wafer target used for the LZP alignment system. If the layer on the wafer which forms both the target and the background absorbs the alignment illumination to the same degree, and if the phase retardation of the two areas on the wafer is the same, then diffraction of the light will not occur. Actually, other combinations of phase retardation and absorptions will also give null diffraction, i.e., they will cancel each other out. Small perturbations from the null cases will give some signal, but the signal must be above a certain level before accurate alignments can be made.

SUMMARY OF THE INVENTION

The present invention utilizes an alternative wavelength of laser illumination in the linear zone plate alignment system since it has been found that the film(s) on the wafer interacts with such different wavelength differently with either a different absorption factor or a different phase retardation of the target film relative to the background film. Such difference causes the laser beam to diffract sufficiently so as to cause an acceptable and stronger signal to be produced, with a resultant more accurate linear zone plate alignment. An alternate laser beam of different wavelength is provided in the apparatus so that two beams may either be separately or be serially detected so that the probability of a strong signal is enhanced, regardless of the choice of wafer layer or wafer layer thickness. The wavelength of the alternate laser source should be chosen so that the layer thicknesses which cause weak diffraction of the first illumination wavelength will not be the same as the thicknesses which cause weak diffraction of the second wavelength. By employing a properly chosen second wavelength, there is a high probability that at least one of the two wavelengths will give a strong signal, regardless of the choice of layer thickness.

Particularly, each target mark sets of linear Fresnel zones on the mask and the reflecting grating(s) on the wafer pattern has its own or a partially shared optical channel and its own laser beam. Each optical channel can detect two separate return signals normally of different strengths for better mask-to-wafer alignment control.

BRIEF DESCRIPTION OF THE DRAWINGS

FIG. 1 is a schematic plan view of the linear Fresnel zone patterns on the mask and wafer.

FIG. 2 is a schematic side view of the linear zone plate alignment technique showing forward tilt of the laser illumination on the alignment targets FIG. 3 is an isometric diagram showing a pattern mask and wafer alignment target layout.

FIG. 4 is a schematic view of the optical alignment apparatus according to the invention.

DETAILED DESCRIPTION

The structure of the linear Fresnel zone patterns themselves is very simple. Each one consists of parallel rectangular stripes of various widths and spacing, as shown in FIG. 1. For a 30 micron focal length zone plate with 21 stripes and with He-Ne laser illumination, the finest line to be patterned is 0.56 micron, which is compatible with the 0.5 micron linewidth to be printed. The overall width of such a target is 42 microns. A typical length is 500 microns for a single target, or 100 microns for multiple targets. The zone plate pattern is defined in the absorber layer of the x-ray mask by alternating clear and opaque stripes. For maximum efficiency into the first order focus, the central zone of the linear zone plate is transparent The geometry of the wafer target is also shown in FIG. 1. The width is typically 1.5 micron. The length is identical to the mask target length.

The wafer target can be etched directly into the silicon wafer, producing a phase contrast grating, or, they can be defined in the circuit layers, producing combination of phase contrast and reflection coefficient contrast. As in all laser-diffraction based alignment systems, the nature and thickness of the layers involved in the definition of the wafer target have a great effect on the alignment signal intensity.

The alignment modules, i.e. the package combination of the optics, the laser sources and detectors, are automatically positioned to accommodate different field sizes and different target sets. A positioning accuracy of 20 microns is more than sufficient since the laser beams are about 0.5 mm in diameter and are, therefore, easily centered on the mask targets.

The alignment method is based upon the use of transmission linear Fresnel zone plates as mask targets and of reflection line gratings as wafer targets, as is seen in Fay et al. U.S Pat. No. 4,311,389.

The zone plates have a first order focal length equal to the proximity gap distance between the mask and wafer. The zone plates concentrate a parallel laser beam incident on the mask into a line focus on the wafer surface as shown in FIG. 2. The light reflected by the wafer line grating is diffracted into its various orders. This diffraction allows an alignment signal to be spatially separated, freeing it from optical interference with the light reflected by the mask target. Without the diffraction, the mask target reflection would be the dominant signal, due to the relatively low efficiency of linear zone plates operating at the first order focus.

The alignment signal, usually the first order diffracted signal, peaks when the mask and wafer targets are aligned If the proximity gap is not exactly equal to the zone plate focal length, the light reaching the wafer surface is not at optimum focus and, therefore, the amplitude of the peak signal is reduced. The alignment signal can thus be used to adjust the proximity gap to a nominal value with an accuracy of 0.5 micron or better. Furthermore, because the defocusing is symmetrical, the alignment accuracy is preserved when the gap is purposely made different from the nominal 30 microns, an action which is sometimes necessary to compensate for small linear magnification errors between the mask and the wafer.

Because of the one-dimensional structure of the alignment targets, three sets of them are required to achieve in-plane X-Y-$\theta$ alignment. The system achieves out-of-plane alignment by using the gap dependency of the three available alignment signals to level the wafer and to set the proximity gap at three points with an accuracy better than 0.5 micron. The signal is most intense when the wafer is aligned and at the correct gaps. Perturbing the gap and detecting an increase in signal, suggests the direction that the gap should be changed until the maximum is achieved. In the current embodiment, the gap is adjusted quasi-continuously, while the signal values at various gaps are stored by the electronics. The data is inserted into a curve fitting algorithm to determine the optimum adjustment to correct the gap. The three alignment targets (X, $Y_1$, and $Y_2$) are radially oriented near the edge of the field, as shown in FIG. 3.

This configuration of marks is auto-centering and is unaffected by linear relative distortion between mask and wafer. It always produces a unique alignment position in which the center O and $O_1$ of the mask and wafer fields are aligned. Each target mark set has its own optical channel, and its own laser beam. Each laser beam directed at targets X, $Y_1$, and $Y_2$ is tilted at an angle $\theta$, as shown in FIG. 3. Each optical channel can detect two return signals (1 and 2).

Because of the forward tilt of the laser beam and because of the divergence of the X-ray beam, alignment targets inside the field (up to 5 mm from the field edge, typically) can be sensed with no shadowing caused by the alignment optics. Therefore, it is very easy to generate multiple alignment targets. If the bisecting scribe lines shown in FIG. 3 have a width of 100 microns, then 20 sets of targets can be accommodated.

The relative linear distortion between mask and wafer is measured with the help of a fourth, transversely oriented, target pair and associated optical system (D in FIG. 3). The change in the gap required to compensate for measured distortion is determined and implemented before final alignment takes place.

The system achieves closed loop automatic alignment by using a scanning mirror and simple optics to modulate the incidence angle of the laser beam on each mask target, resulting in a transverse sweep of the focused line spots. Digital phase lock detection of the modulated signals produces error signals which are used to drive the X-Y-$\theta$ wafer and mask fine stages in closed loop mode.

As seen in FIG. 4 an alternate or second laser beam source is provided in the optical alignment apparatus.

The wavelength of the alternate laser source should be chosen so that the layer thicknesses which cause weak diffraction of the first illumination beam wavelength will not be the same as the thicknesses which cause weak diffraction of the second beam of different wavelength. By employing a properly chosen second wavelength, there is a high probability that at least one of the two wavelengths will give a strong signal, regardless of the choice of layer thickness.

The FIG. 4 alignment system is used with respect to a wafer 10 and mask 11 both of which may be oriented vertically or horizontally or at a prescribed angle in actual practice. For effective lithography it is necessary to have the mask and wafer be spaced from each other in accurate parallel planes. Monochromatic light from a laser source 20 for example from a red Helium-Neon laser of 633 mm($\lambda_2$) is impinged on the alignment targets on the mask 11 and are diffracted as beam $\alpha_1$ through a ¼ plate 12 to improve signal level to a first convex lens 13. The beam $\alpha_1$ (shown in solid lines) is normally twice the incident angle (i in FIG. 2) from the perpendicular. The beam is then directed through a scanner 14, through a second convex lens 15 to a 45° mirror 16, through filters 17a and 17b to eliminate stray reflections from the lenses and optical components and the resultant signal is detected by photomultiplier tube 18 as is known in the prior art. Filter 17a is a polarizer filter and filter 17b is an interference filter to eliminate stray light of an unwanted wavelength, i.e. the alternative wavelength.

The second wavelength should be different from the first by more than 10 to 15%. If the first wavelength is 633 nm light from the red He-Ne laser, the second wavelength should be longer, since the typical x-ray mask currently used becomes more absorbant with shorter wavelength illumination. In addition, it is preferred that the second wavelength ($\lambda_2$) not be a simple multiple of the first wavelength ($\lambda_1$) in order to reduce the probability of the second wavelength not diffracting when the first does not diffract. Actually, it is best that:

$$\lambda_2 \neq \lambda_1 \cdot m/n$$

where m and n are different low valued integers.

The choice of wavelengths is limited as there are only a few types of lasers currently available which are compact and inexpensive. However, a choice which appears to be acceptable at this time is using Ga As laser for the second laser illumination with $\lambda_2$ 780 nm (m=16, n=13).

The design of the target on the mask depends on the local length of the grating (which should be equal to the nominal mask-to-wafer gap), the wavelength of illumination used, and the number of zones chosen for the target. Typically about 21 zones are used in the current embodiment. Nonuniform grating lines $r_1, r_2, r_3, \ldots, r_n$ are employed on the mask, where $r_n$ represents the distance from the center of the target to the nth edge which forms one side of a grating line. The formula used to design a particular target and determine the required $r_n$'s is:

$$r_n^2 = nf\lambda + n^2\lambda^2/4$$

in which $\lambda$ is the wavelength of the illumination and f is the focal length of the Fresnel zone target, normally of from 25 to 40 microns. Typically, the central zone of the target is optically transparent while the alternate grating lines are either optically opaque, or they are transparent but made such as to cancel the light transmitting through these parts of the target to be 180° out of phase with the corresponding alternate parts. This phase effect can be made by etching the Fresnel zone target pattern into the optically clear mask to a suitable depth. The depth of etching depends on the index of refraction of the mask material, as is well known by optical engineers familiar with the art.

In order to employ the second wavelength and not change the mask to wafer spacing as compared to the first wavelength case, a second mask LZP target must be employed which is optimized for the given wavelength and mask to wafer spacing.

In addition, the wafer grating pitch may be different than that used for the first wavelength beam. The correct wafer grating pitch is determined primarily by the wavelength of the illumination and the particular optical design employed within the LZP alignment system. In FIG. 2, the incident beam angle is i degrees off of perpendicular. The zero order reflection then is $-i$ degrees off of perpendicular. The well known grating equation can then be applied to determine the angle that the return beams will make after the primary beam is diffracted by the wafer grating. This equation is:

$$d(\sin i + \sin\theta) = m\lambda$$

where d is the pitch of the grating, $\lambda$ is the incidence angle, $\theta$ is the diffracted angle measured from the perpendicular, m is the order number, and $\lambda$ is the wavelength. Uniform grating lines of 3.0 microns pitch (center to center) are employed in the wafer in one embodiment of the invention, using an incidence angle, i, of 6.77 degrees. For two wavelengths, 633 nm and 780 nm the angle of the return beams $\alpha_1$ and $\alpha_2$ shown in FIGS. 4 are then +1.4 and −1.4 degrees, respectively.

The alignment system incorporates a second or alternate laser beam source 30, for example a gallium arsenide (GaAs) laser having a wavelength ($\lambda_2$) of 780 nm. A second beam from source 30 passes through beam splitter 31 so that the second beam has an axis coincident to the axis 9 of the first beam from source 20. The second beam is diffracted, after being reflected by the wafer grating, by the targets on the mask 11 to form a diffracted beam $\alpha_2$ (shown in dashed lines) which is directed by mirror 32 to a second photomultiplier tube detector 33. The stronger of the signals on tubes 18 or 33 is determined by the signal monitoring electronics and associated computer software. In an alternative embodiment, the signals from both source diffractions may be summed to derive a strong alignment signal. Electrical signals are then directed to a piezoelectric transducer (not shown) for moving the wafer and its monitoring stage as is known in the art in a direction so as to optimize the parallelism of the mask and wafer and conclude a satisfactory alignment.

The method of the invention involves the following steps:
1. inscribing a mark on a first plane in the form of linear Fresnel zones which are alternately opaque and transparent and perpendicular to the desired alignment axis in the planes;
2. inscribing a reflecting grating on a second plane;
3. illuminating said zones by a first monochromatic light beam having a first wavelength;
4. illuminating said zones by a second monochromatic light beam having a second wavelength different from said such first wavelength;
5. detecting radiation reflected by said second plane and emerging from said zones on said first plane, resultant from illumination by such first and second monochromatic light beams; and
6. based on the stronger of the radiation from reflection of said first monochromatic light beam on said second monochromatic light beam, utilizing said stronger radiation to displace the two planes with respect to one another in the alignment axis until the stronger detected radiation passes through an optimizing alignment of said mark and said grating.

It is contemplated that the improved alignment system may utilize a common photomultiplier for detecting the strongest signal from either of the lasers. A suitable switching circuit is provided to switch the IR (GaAs) laser and the HeNe laser on or off and detect the resultant signal 1 or 2 along the same optical path.

The above description of embodiments of this invention is intended to be illustrative and not limiting. Other embodiments of this invention will be obvious to those skilled in the art in view of the above disclosure.

We claim:
1. An optical alignment apparatus comprising:
    a mask;
    a semiconductor wafer spaced from said mask, said wafer having a reflecting grating thereon;
    a target of linear Fresnel zones on said mask for alignment of said mask and wafer;
    a first monochromatic light source for projecting a first beam of illumination having a first wavelength onto said mask;
    a second monochromatic light source for projecting a second beam of illumination on said mask, said second monochromatic light source having a second wavelength different from the first wavelength of said first monochromatic light source;
    optical means for transmitting said first and second beams as diffracted by said target and reflected from said reflecting grating; and
    detector means for detecting radiation resultant from each of said first and second diffracted beams from said target for determining a signal extremum using said first and/or second beams when an optimum alignment condition exists.
2. The apparatus of claim 1 wherein said optical means includes a beam splitter for orienting said second beam of illumination from said second monochromatic light source on the same axis as the first beam of illumination from said first monochromatic light source.
3. The apparatus of claim 1 wherein said detector means comprises a first detector for detecting a signal from diffraction of said first beam of illumination from said first monochromatic light source; and a second discrete detector for detecting a signal from diffraction of said second beam of illumination from said second monochromatic light source.

4. The apparatus of claim 3 in which said first and second detectors are photomultiplier tubes.

5. The apparatus of claim 1 wherein said detector means includes a photomultiplier tube and means for switching said first and second monochromatic light sources on and off in seriatim for determining the maximum radiation from one of said first and second diffracted beams.

6. The apparatus of claim 1 wherein said detector means is positioned in accordance with the optical axis of the first and second beams diffracted by said target and said reflecting grating.

7. The apparatus of claim 1 in which said first monochromatic light source comprises a helium-neon laser and said second monochromatic light source comprises a gallium-arsenide laser.

8. The apparatus of claim 1 wherein the wavelength of said second monochromatic light source is not a simple multiple of the wavelength of said first monochromatic light source.

9. The apparatus of claim 8 wherein the wavelength of said second monochromatic light source is about equal to the wavelegnth of said first monochromatic light source times m divided by n, where m and n are different low valued integers.

10. The apparatus of claim 9 where m=16 and n=13.

11. The apparatus of claim 1 in which said targets include first and second mask targets, each optimized for one of the first and second beam wavelengths and the mask-to-wafer spacing.

12. The apparatus of claim 1 in which said wafer reflecting grating includes first and second reflecting gratings of different grating pitch dependent on the wavelengths of said first and second beams of illumination from said first and second monochromatic light sources.

13. The apparatus of claim 12 in which the grating pitches are of such value as to allow the return beams of both wavelengths to follow the same path to a single detector.

14. The apparatus of claim 12 in which the grating pitches are of such value as to allow the return beams of both wavelengths to follow the same path initially and then split so that each beam is detected by a separate detector.

15. A method for optically aligning inscribed targets in first and second near planes comprising the steps of:
inscribing a mark on a first plane in the form of linear Fresnel zones perpendicular to the desired alignment axis in the planes;
inscribing a reflecting grating on a second plane;
illuminating said zone by a first monochromatic light beam having a first wavelength;
illuminating said zones by a second monochromatic light beam having a second wavelength different from said such first wavelength;
detecting radiation reflected by said second plane and emerging from said zones on said first plane, resultant from illumination by such first and second monochromatic light beams; and
based on the stronger of the radiation from reflection of said first monochromatic light beam or said second monochromatic light beam, utilizing said stronger radiation to displace the two planes with respect to one another in the alignment axis until the stronger detected radiation passes through an optimizing alignment of said mark and said grating.

16. The method of claim 15 in which said first monochromatic light beam comprises a helium-neon laser and second monochromatic light beam comprises a gallium arsendie laser.

17. The method of claim 15 in which the second wavelength is about equal to the first wavelength times m divided by n, where m and n are different low valued integers.

* * * * *